United States Patent [19]
Kushner

[11] Patent Number: 5,878,335
[45] Date of Patent: *Mar. 2, 1999

[54] COMPOSITE DIRECT DIGITAL SYNTHESIZER

[75] Inventor: Lawrence J. Kushner, Andover, Mass.

[73] Assignee: Massachusetts Institute of Technology, Cambridge, Mass.

[ * ] Notice: The term of this patent shall not extend beyond the expiration date of Pat. No. 5,303,412.

[21] Appl. No.: 211,652

[22] PCT Filed: Mar. 12, 1993

[86] PCT No.: PCT/US93/02445

§ 371 Date: Apr. 11, 1994

§ 102(e) Date: Apr. 11, 1994

[87] PCT Pub. No.: WO93/18578

PCT Pub. Date: Sep. 16, 1993

Related U.S. Application Data

[63] Continuation-in-part of Ser. No. 851,481, Mar. 13, 1992, Pat. No. 5,303,412.

[51] Int. Cl.⁶ .................................................. H04B 1/40
[52] U.S. Cl. ............................. 455/260; 455/76; 331/38; 331/43; 331/108 L
[58] Field of Search .................................... 455/260, 258, 455/259, 304, 33.1, 76, 89, 109; 331/37, 38, 40, 42, 43, 108 C; 375/202

[56] References Cited

U.S. PATENT DOCUMENTS

| | | | |
|---|---|---|---|
| 2,927,280 | 3/1960 | Cumming | 331/42 |
| 3,749,837 | 7/1973 | Doughty | 179/1 J |
| 4,761,798 | 8/1988 | Griswold, Jr. et al. | 375/59 |
| 4,926,130 | 5/1990 | Weaver | 331/38 |
| 5,063,361 | 11/1991 | Smith et al. | 332/103 |
| 5,162,763 | 11/1992 | Morris | 455/109 X |
| 5,230,088 | 7/1993 | Kramer, Jr. et al. | 455/260 X |
| 5,303,412 | 4/1994 | Kushner | 455/260 |

FOREIGN PATENT DOCUMENTS 0419680  3/1991  European Pat. Off. .

OTHER PUBLICATIONS

Manassewitsch, V., "Frequency Synthesizers Theory and Design," publication of Wiley & Sons, pp. 37–43, (1976).

Topi, M., "An Eight—Phase Broadband Serrodyne Modulator," *IEEE MTT–S Digest*, pp. 432–434, (1983).

Yuan, H., et al., "The Development of Heterojunction Integrated Injection Logic," *IEEE Transactions on Electron Devices*, 36(10):2083–2092, (Oct. 1989).

Mitchell, S., et al., "Wideband Serrodyne Frequency Translator," *Applied Microwave*, pp. 58, 60–62, 66–67, (Summer 1990).

Wang, K.C., et al., "Diode–HBT–Logic Circuits Monolithically Integrable with ECL/CML Circuits," *Tech. Dig. of IEEE GaAs IC Symposium*, pp. 91–94, (1991).

Helms, D., et al., "Wideband Very Fast Set–on Receiver," *Tech. Dig. of IEEE GaAs IC Symposium*, pp. 291–294, (1990).

(List continued on next page.)

*Primary Examiner*—Edward F. Urban
*Assistant Examiner*—Philip J. Sobutka
*Attorney, Agent, or Firm*—Hamilton, Brook, Smith & Reynolds, P.C.

[57] ABSTRACT

A low-power digital frequency synthesizer combining direct digital frequency synthesis techniques with serrodyne frequency translation principles to produce a wideband frequency response with high spectral purity. A conventional direct digital synthesizer is used to generate a high-resolution analog carrier signal from a low-speed digital clock signal. The carrier signal is phase modulated by a low-resolution signal generated from a high-speed digital clock signal. The modulation signal is a higher frequency signal than the carrier signal. The phase modulation is accomplished by exact decoded gain elements. The spectral purity of the resulting high-resolution output signal is unobtainable by conventional direct digital synthesizers, while providing significant power savings.

54 Claims, 12 Drawing Sheets

OTHER PUBLICATIONS

Stanford Telecom, "Products for Direct Digital Synthesis," Advertisement (1991).

Stanford Telecom, "0–400 MHz GaAs Direct Digital Phase Modulated Synthesizer Hybrid STEL–2373," Marketing Brochure (1991).

Cumming, R.C., "The Serrodyne Frequency Translator," *Proc. IRE*, pp. 175–186 (Feb. 1957).

Nicholas, H.T., III, et al., "An Analysis of the Output Spectrum of Direct Digital Frequency Synthesizers in the Presence of Phase–Accumulator Truncation," 41st Annual Frequency Control Symposium, pp. 495–501 (1987).

Andrews, G. V., et al., "A Monolithic Digital Chirp Synthesizer Chip with I and Q Channels," GaAs IC Symposium, pp. 19–22 (1991).

Qualcom, Inc., "Direct Digital Synthesis: 21 Questions and Answers for RF Engineers," Marketing Brochure (1990).

Sciteq Electronics, Inc., "Phase Shifter is Doppler Simulator," Advertisement.

Nagurney, L.S., "A Multi–Emission Frequency Domain Modulator," 40th IEEE Vehicular Technology Conference, 6 May 1990, Orlando, Florida, pp. 71–74.

Cumming, R.C. "Serrodyne Performance and Design," *The Microwave Journal*, pp. 84–87, (Sep. 1965).

Klein, G., et al., "The Digilator, a New Broadband Microwave Frequency Translator," *IEEE Transactions on Microwave Theory and Techniques*, MTT–15(3):172–179, (Mar. 1967).

Greenbaum, M., et al., "Serrodyne Frequency Translation Using Stepped Modulation Waveforms," *IEEE Transactions on Aerospace and Electronic Systems*, pp. 537–538, (Jul. 1974).

COMPOSITE DIRECT DIGITAL SYNTHESIZER

RELATED APPLICATIONS

This application is the U.S. National Phase of Application PCT/US93/02445 filed 12 Mar. 1993, which is a continuation-in-part of U.S. Ser. No. 07/851,481 filed Mar. 13, 1992, now U.S. Pat. No. 5,303,412, the teachings of which are incorporated herein by reference.

GOVERNMENT SUPPORT

The invention described herein was supported in whole or in part by Contract Number F19628-90-C-0002 from the Department of the Army. The Government has certain rights in the invention.

BACKGROUND OF THE INVENTION

Digital frequency synthesizers are replacing oscillators in a number of important applications such as frequency generating subsystems, test equipment and communication systems. In particular, many communication systems use complex modulation schemes which are often more easily implemented using digital frequency synthesis.

Battery-powered communication systems using spread spectrum technology are one category of applications that benefit from digital frequency synthesis. This category includes cellular telephone systems and ground terminal communication systems. Such applications may use frequency hopping techniques to spread a signal over the channel bandwidth. These applications will benefit from a low-power, wideband frequency synthesizer with high spectral purity. Current technology has failed to achieve those goals.

One existing device is the direct digital synthesizer (DDS). Conventionally, a high-resolution DDS generates wideband analog signals using a high-speed digital clock. For example, frequency responses up to 400 MHz have been demonstrated using a 1 GHz clock. However, due to phase truncation effects, amplitude quantization effects, and digital-to-analog converter (DAC) nonlinearities and glitches, a large number of high level spurious signals are present in the output frequency band. These spurious signals increase with the clock frequency.

In addition to spectral purity problems, conventional DDSs suffer from hardware constraints, Because of the high clock frequencies, conventional high-speed DDSs are fabricated in Gallium Arsenide (GaAs). Furthermore, the conventional DDS dissipates higher power when driven at high clock frequencies.

Serrodyne modulators have been used to modulate high frequency analog signals by lower frequency digital signals. For example, this technique is used to generate frequency chirps for radar systems. The resulting frequency translation is relatively narrow band, typically less than one octave. In addition, the resulting signal has mediocre near carrier, spurious performance, typically −15 to −30 dBc. The use of analog devices to generate the phase shifts further limits performance.

One such serrodyne modulator is discussed by Smith et al. in U.S. Pat. No. 5,063,361, which discusses a direct digital synthesizer having a phase accumulator for changing the phase of an RF signal. The device uses dual shifter channels in a ping-pong arrangement. Channel switching is done using make-before-break RF switches, which are switched on every clock cycle alternate phase shifting of the RF signal in alternate channels. The DDS is implemented as a digital monolithic microwave integrated circuit (MMIC).

Phase modulation has been discussed by Hiramatsu in European Patent Publication 0 419 680 as frequency-modulating a digital signal by a carrier frequency. In particular, an analog modulation signal is digitally processed to be FM modulated. The output signal is centered at the carrier frequency.

Doughty in U.S. Pat. No. 3,749,937 discusses an electronic musical tone modifier. An analog audio frequency is FM modulated by a sub-audible signal. The modifier can include a digital or an analog shift register to perform the frequency modulation. The output signal is an analog audio signal.

SUMMARY OF THE INVENTION

A direct digital frequency synthesizer for generating a wideband high-resolution frequency response. A low-speed, high-resolution direct digital synthesizer and a low pass filter are used to generate a narrow-band, high-resolution frequency response. A phase shifter modulates the high resolution frequency by a high frequency signal. The high frequency signal is provided by a high-speed, low-resolution phase accumulator clocked at a high frequency. The phase shifter uses a serrodyne vector modulation technique to generate a high resolution frequency with a wideband frequency response. The present composite direct digital synthesizer provides a portable, battery powered generator having the speed, bandwidth and resolution that is normally associated with much heavier and high power consuming systems. By utilizing a circuit in which only a small portion of the device is required to clock at a high speed, it is possible to substantially reduce the DC power necessary to operate the device. This system also substantially reduces or eliminates phase truncation effects, amplitude quantization effects, and DAC non-linearities and glitches found in conventional systems.

The invention can also be fabricated in a single chip or in a multi-chip module to provide for assembly in portable battery powered communication systems requiring more complex modulation. The system meets the low power and high spectral purity requirements for portable ground terminal, space applications as well as for cellular telephone networks and wireless Local Area Networks.

DESCRIPTION OF A PREFERRED EMBODIMENT

A preferred embodiment of the present invention combines direct digital frequency synthesis techniques with the serrodyne frequency translation principle to create digitally synthesized frequencies. A preferred embodiment obtains a wideband frequency response with high spectral purity. Because phase shifts are generated digitally using wideband gain elements and switches, the invention obtains spectral purity unobtainable through purely analog means. A preferred embodiment achieves a wideband, high-resolution frequency synthesis while consuming low power.

Preferred embodiments of the invention use a digital serrodyne technique to shift a finely-adjustable (i.e., tunable), low-frequency local oscillator by a relatively large amount. This frequency shift results in a large percentage bandwidth. For example, a preferred embodiment of the invention having a high-frequency digital clock of 800 MHz, a 7-bit high-speed accumulator, and a low frequency 32-bit DDS clocked at 50 MHz generates an output bandwidth of approximately 10 to 320 MHz (i.e., five octaves). Moreover, the output bandwidth has an extremely fine (approximately 0.01 Hz) resolution.

Figure 1:
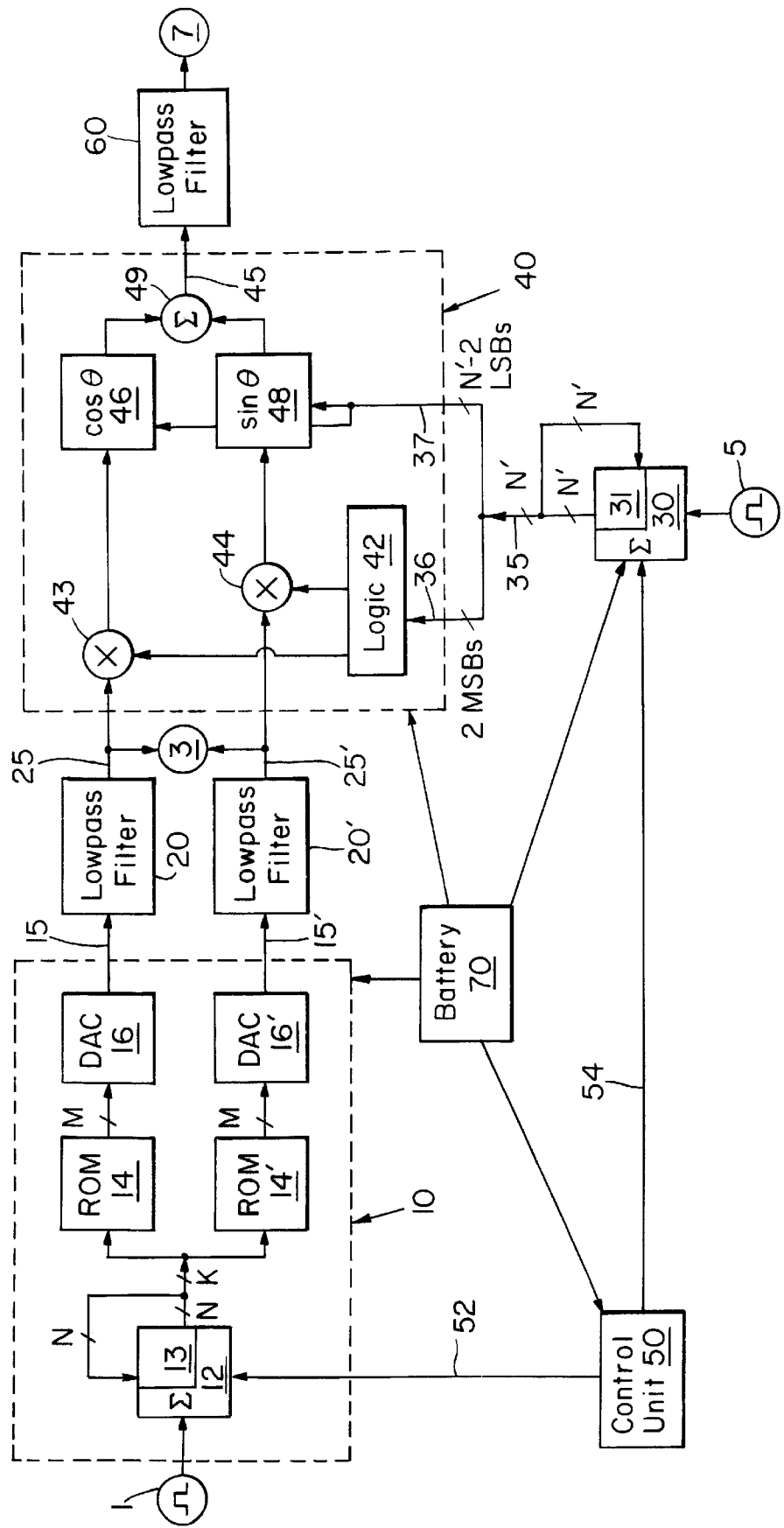
FIG. 1 is a block diagram of a preferred embodiment of the invention.

FIG. 1 shows a simplified block diagram of a preferred embodiment. The system generates an output signal 7 of frequency $f_o$ from two periodic clock signals 1,5. A low-speed clock 1 generates periodic digital clock pulses with frequency, $f_r$, less than $f_o$. The invention uses the low-speed clock 1 to generate a carrier signal, c(t), with a real-value expressed as $$c(t)=a_c(t) \sin [2\pi f_c t+\phi(t)]; \quad (1)$$

where $a_c(t)$ denotes the amplitude of c(t) and $\phi(t)$ denotes the phase of c(t). In addition, a high-speed clock 5 generates periodic digital clock pulses with frequency, $f_r'$, greater than $f_o$ and greater than or equal to $4f_o$. The invention uses the high-speed clock 5 to phase modulate the carrier signal to produce an output signal, o(t), of the form $$o(t)=a_o(t) \sin [2\pi f_c t+\theta(t)]; \quad (2)$$

where $a_o(t)$ denotes the amplitude of the output signal and $\theta(t)$ denotes the periodic phase modulation. In contrast to a conventional modulator, the carrier signal is being modulated by a relatively high frequency signal.

A control unit 50 provides the composite DDS with an external interface compatible with conventional DDS interfaces. The control unit 50 supplies the high-speed phase accumulator 30 with the low-resolution phase data using data bus 54 and the low-speed phase accumulator 12 with the high-resolution phase data using data bus 52. In a preferred embodiment, the frequency of the high-speed clock 5 is a power-of-2 multiple of the frequency of the low-speed clock 1. The most significant bits (MSBs) represent the low-resolution phase data and the least significant bits (LSBs) represent the high-resolution phase data.

On every clock pulse of clock 1, the low-speed phase accumulator 12 increments its N-bit data register 13 by an increment value, I, selected by control unit 50 based upon the selected carrier signal frequency. This increment value is applied on data bus 52 from control unit 50. The control unit 50 computes the increment value such that the phase accumulator's data register 13 overflows with the same frequency as the frequency of the carrier signal, $f_c$. The equation for computing the phase increment value for an N-bit phase accumulator is given by $$I = 2^N \left( \frac{f_c}{f_r} \right) \quad (3)$$

where $f_c$ denotes the frequency of the carrier signal output from the DDS 10 and $f_r$ denotes the frequency of the clock. Thus the control unit 50 changes the carrier frequency by changing the increment value. Because an analog signal is being generated from the low-speed digital clock 1, the carrier signal 3 frequency, $f_c$, is limited to the Nyquist frequency of the low-speed clock 1 (i.e. $f_c$ must be less than or equal to $f_r/2$).

Figure 2:
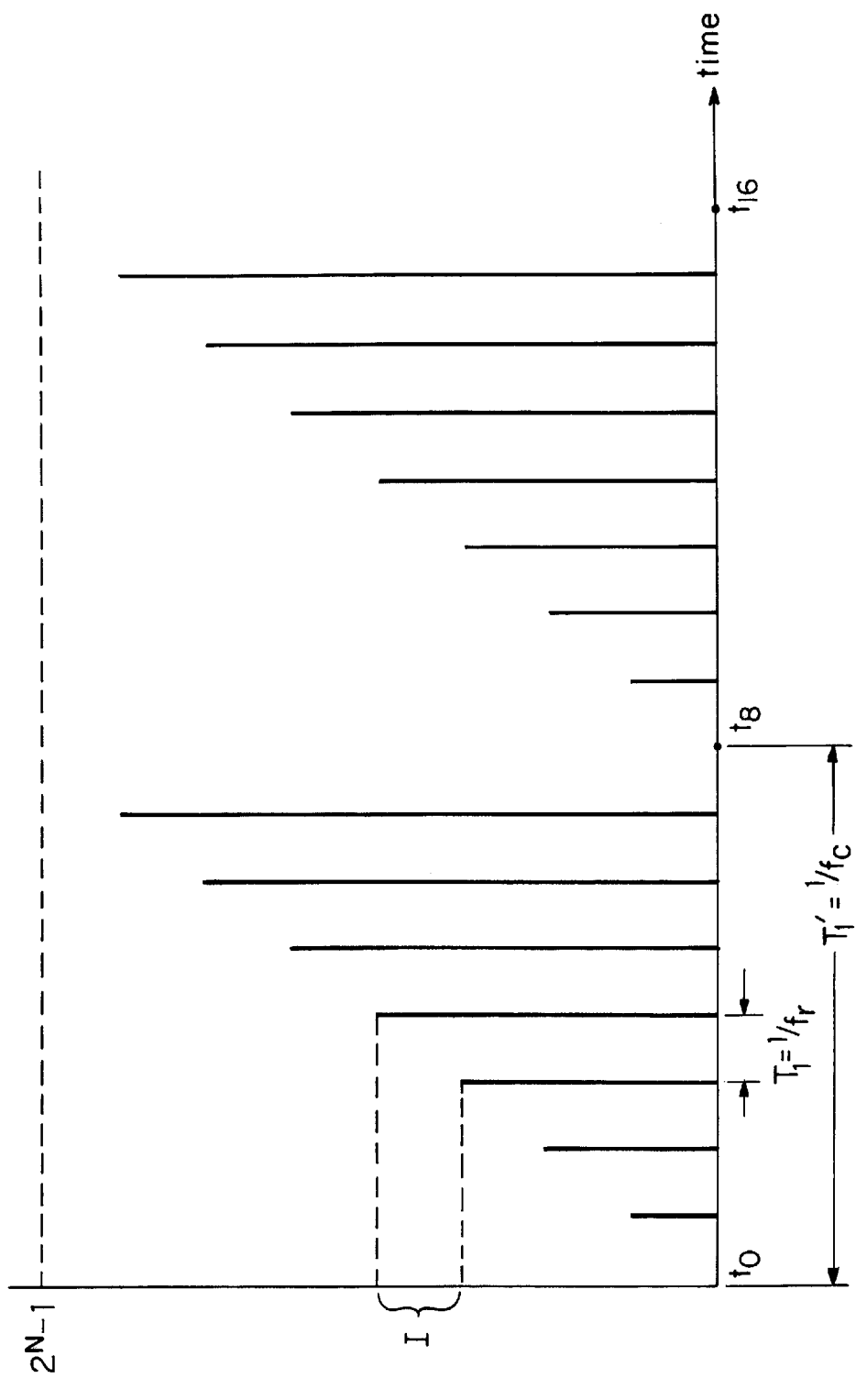
FIG. 2 is a graphical representation of the signal output from low-speed phase accumulator 12 of FIG. 1.

FIG. 2 shows a representative signal generated by the low-speed phase accumulator 12. The low-speed clock 1 generates a pulse every $T_1$ seconds, where $T_1$ is equal to $1/f_r$. On every clock pulse of the low-speed clock 1, the low-speed phase accumulator 12 increments the N-bit register 13 by the phase shift increment, I. The N-bit register 13 overflow occurs every $T_1'$ seconds, where $T_1'$ is equal to $1/f_c$. In this case overflow occurs every eight clock pulses ($t_8, t_{16}, \ldots$). Therefore, the phase increment, I, is equal to $(2^N-1)/8$.

From the N-bits of low-speed phase accumulator 12, the MSB (not shown) is a sign bit, the next-most-significant bit (not shown) is the quadrant bit. Of the remaining N-2 bits, K bits of phase data is used to construct the first quadrant signal. The two MSBs use trigonometric identities to translate the first quadrant phase data to four quadrants of phase data. The larger the value of K, the more phase resolution is available. The device has a high phase resolution if the low-speed accumulator has at least about 20 bits of phase resolution (i.e. N is greater than or equal to 20).

The K-bits are used as an address into read only memory (ROM) 14,14'. Phase truncation occurs if K is less than N-2 because the resolution available in the N-(K+2) bits of the low-speed phase accumulator 12 is not available to the ROM 14,14'. The ROMs 14,14' contain $2^K$ address locations, each address containing an M-bit word.

For each phase value, the ROM 14,14' supplies a M-bit amplitude value. Amplitude quantization errors occur in the ROM 14,14' when the M bits are not sufficient to produce an exact amplitude change when the phase changes. In a preferred embodiment, ROM 14 is a sine function table and ROM 14' is a cosine function table. The ROMs 14,14' produce the quadrature components of the carrier signal, c(t), namely $$y(t)=a_c(t) \sin \omega_c t \quad (4)$$
$$x(t)=a_c(t) \cos \omega_c t$$

Figure 3:
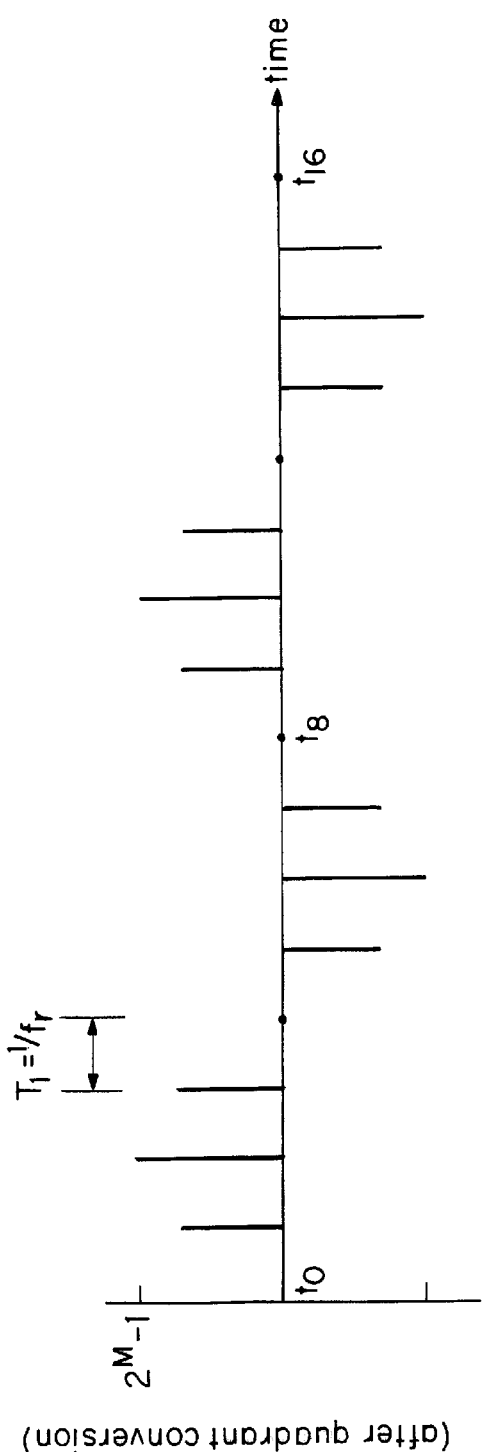
FIG. 3 is a graphical representation of the input signal into the digital-to-analog convertor (DAC) 16 of FIG. 1.

FIG. 3 shows a representative signal generated by ROM 14, y(t), after being translated into four quadrants. This signal is input into DAC 16. On every clock pulse, the ROM 14 computes an amplitude value from the phase accumulator 12 phase data. The amplitude values at $t_0$, $t_8$, and $t_{16}$ correspond to the respective phase data shown in FIG. 2. As in FIG. 2, the output signal period, $T_1$, is equal to eight clock pulses of the low-speed clock 1.

Figure 4:
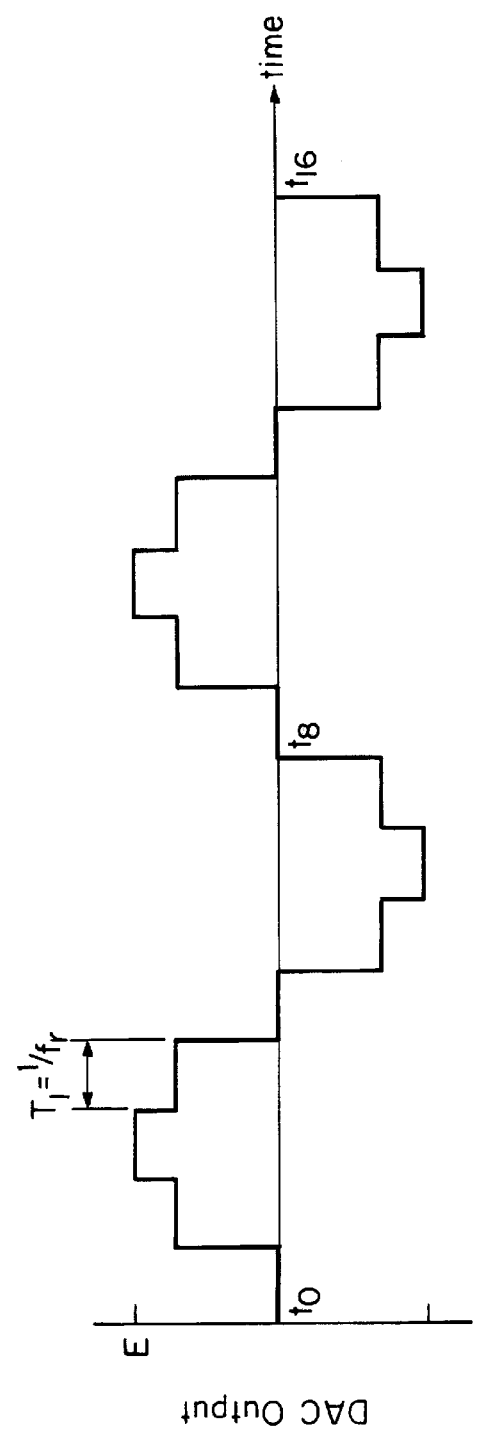
FIG. 4 is a graphical representation of the output from the DAC 16 of FIG. 1.

The digital signal from ROM 14,14' is converted to an analog signal by the respective DAC 16,16'. FIG. 4 shows a representative signal generated by DAC 16. The maximum signal strength, E, is DAC dependent. The analog signals at time $t_0$, $t_8$, and $t_{16}$ correspond to conversion of the respective digital signals shown in FIG. 3. These analog signals are supplied on data busses 15 and 15' to be low pass filtered.

All the above-mentioned components suffer when driven at high clock frequencies. Higher frequencies lead to higher power consumption and thus higher levels of power dissipation. In addition, as the clock speed increases, the DACs 16,16' become more nonlinear. Furthermore, the DACs 16,16' create more severe glitches at higher clock frequencies because the glitch energy occupies a higher percentage of the clock cycle. Finally, higher clock speeds require the use of GaAs components instead of lower power CMOS components. A preferred embodiment uses a low-speed clock 1 to drive the low-speed phase accumulator 12. The frequency of the low-speed clock 1 is chosen to take advantage of a low power logic system, such as used in CMOS devices. In a preferred embodiment, the low-speed clock 1 is operated at a frequency of 50 MHz.

Conventional DDSs are available which provide the functions of the low-speed phase accumulator 12, the ROMs 14,14', and the DACs 16,16'. A more detailed discussion of conventional direct digital synthesizers is provided in V. Manassewitsch, "Frequency Synthesizers Theory and Design" (John Wiley & Sons 1976). Adequate performance can be obtained by substituting a commercially available DDS 10. One adequate substitute is the model STEL-1177 available from Stanford Telecom of Santa Clara, Calif. In particular, the STEL-1177 is a CMOS device using a 32-bit low-speed phase accumulator 12 (N=32) and provides 12 bits of phase resolution to the ROMs 14,14' (K=12). The ROMs 14,14' in turn provide 10 bits of amplitude resolution (M=10). Thus the conventional DDS 10 provides high phase and amplitude resolution.

The low pass filters 20,20' bandlimit the carrier signal output from the DDS 10 to a cutoff frequency. The carrier signal should be bandlimited to reduce the spur energy in the signal. The first significant spur occurs at the frequency given by the equation $$f_s = f_r - f_c. \qquad (5)$$

As $f_c$ approaches $f_r/2$ (the Nyquist frequency), the spur energy increases and may not be distinguishable from the signal energy. To avoid high near-carrier spur energy, conventional DDSs are typically operated to produce output frequencies of about 40% of the clock frequency.

Figure 5:
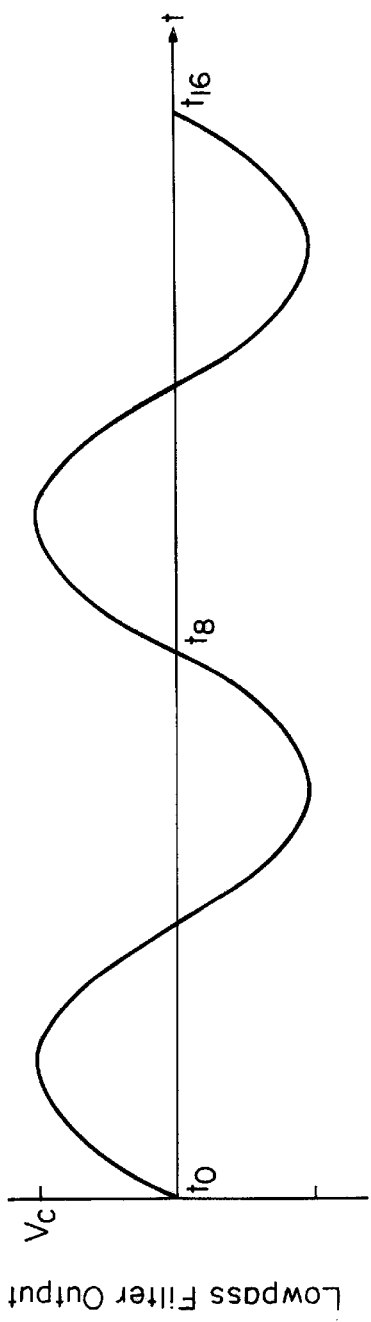
FIG. 5 is a graphical representation of the output from the low pass filter 20 of FIG. 1.

FIG. 5 shows a representative signal generated by low pass filter 20. The maximum signal strength is $V_c$. For an ideal lossless low pass filter, $V_c$ equals E. The analog signal at times $t_0$, $t_8$, and $t_{16}$ correspond to smoothing of the DAC signal data shown at the respective times in FIG. 4. The smoothed carrier signals from low pass filters 20,20' are fed to phase shifter 40 on data busses 25,25'.

The high-speed phase accumulator 30 uses the high-speed clock 5 as a reference signal with frequency $f_r'$. The operation of the N'-bit high-speed phase accumulator 30 is similar to the previously described operation of the low-speed phase accumulator 12. In particular, the control unit 50 computes and supplies high-speed phase accumulator 30 with a phase increment on data bus 54. The control unit 50 calculates the phase increment from the frequency shift necessary to generate the selected output signal 7 by the equation $$I' = 2^{N'} \left( \frac{f_o - f_c}{f_r} \right). \qquad (6)$$

The high-speed phase accumulator's 30 N' bit register 31 supplies phase data to the phase shifter 40 on data bus 35.

In a preferred embodiment, the high-speed phase accumulator 30 has a 7-bit resolution (N'=7) and is driven by a 1.6 GHz clock. Because the high-speed phase accumulator 30 uses only 7-bits, the high-speed phase accumulator 30 is capable of providing only 2.8125 degrees of phase resolution and 12.5 MHz of frequency resolution. Thus, the high-speed phase accumulator 30 is a low resolution phase accumulator. The frequency of the high-speed phase accumulator 30 overflow is used to modulate the carrier signal 3.

Figure 6:
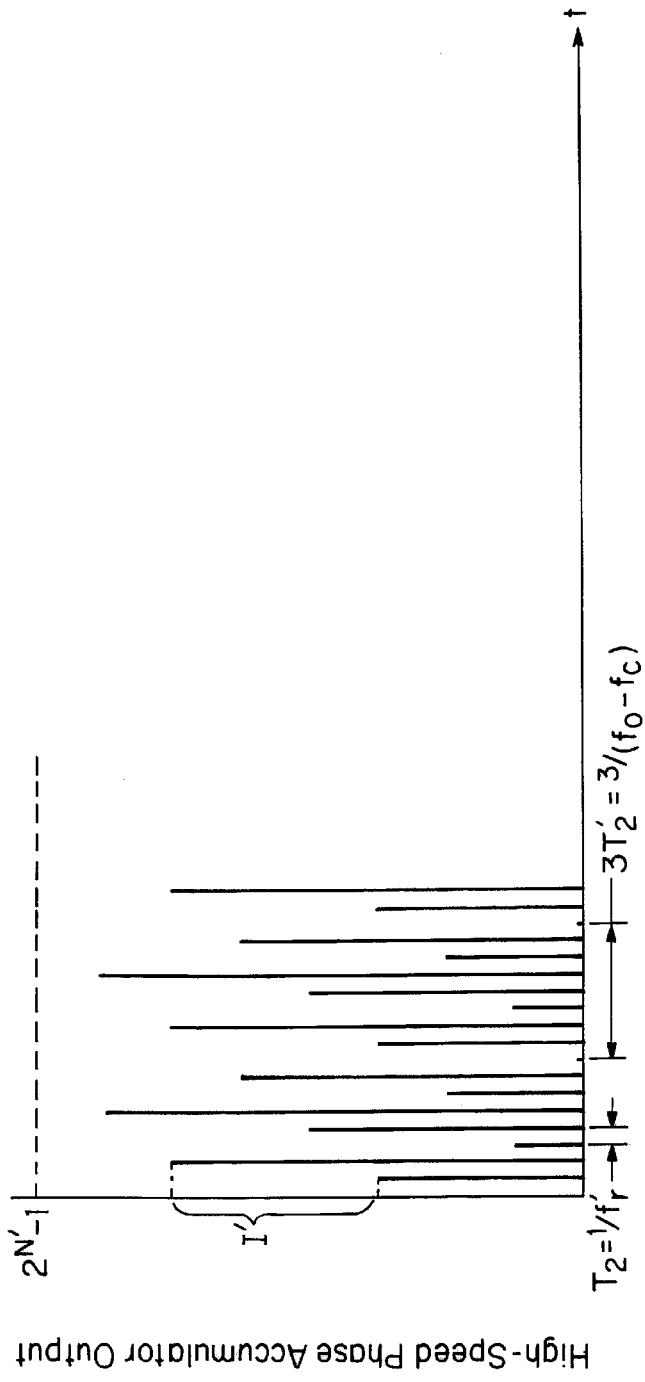
FIG. 6 is a graphical representation of the output from phase accumulator 30 of FIG. 1.

FIG. 6 shows a representative signal generated by high-speed phase accumulator 30, which is available on data bus 35. The high-speed clock 5 generates a pulse every $T_2$ seconds, where $T_2$ is equal to $1/f_r'$. On every clock pulse of the high-speed clock 5, the high-speed phase accumulator 30 increments by the phase shift increment, I'. Overflow occurs every $T_2'$ seconds, where $T_2'$ is equal to $1/(f_o-f_c)$. In this case overflow occurs every two and two-thirds clock pulses. Therefore, the phase increment, I', is equal to $3*(2^{N'}-1)/8$. Indicated in FIG. 6 is a time period equal to three overflow periods.

Figure 7A:
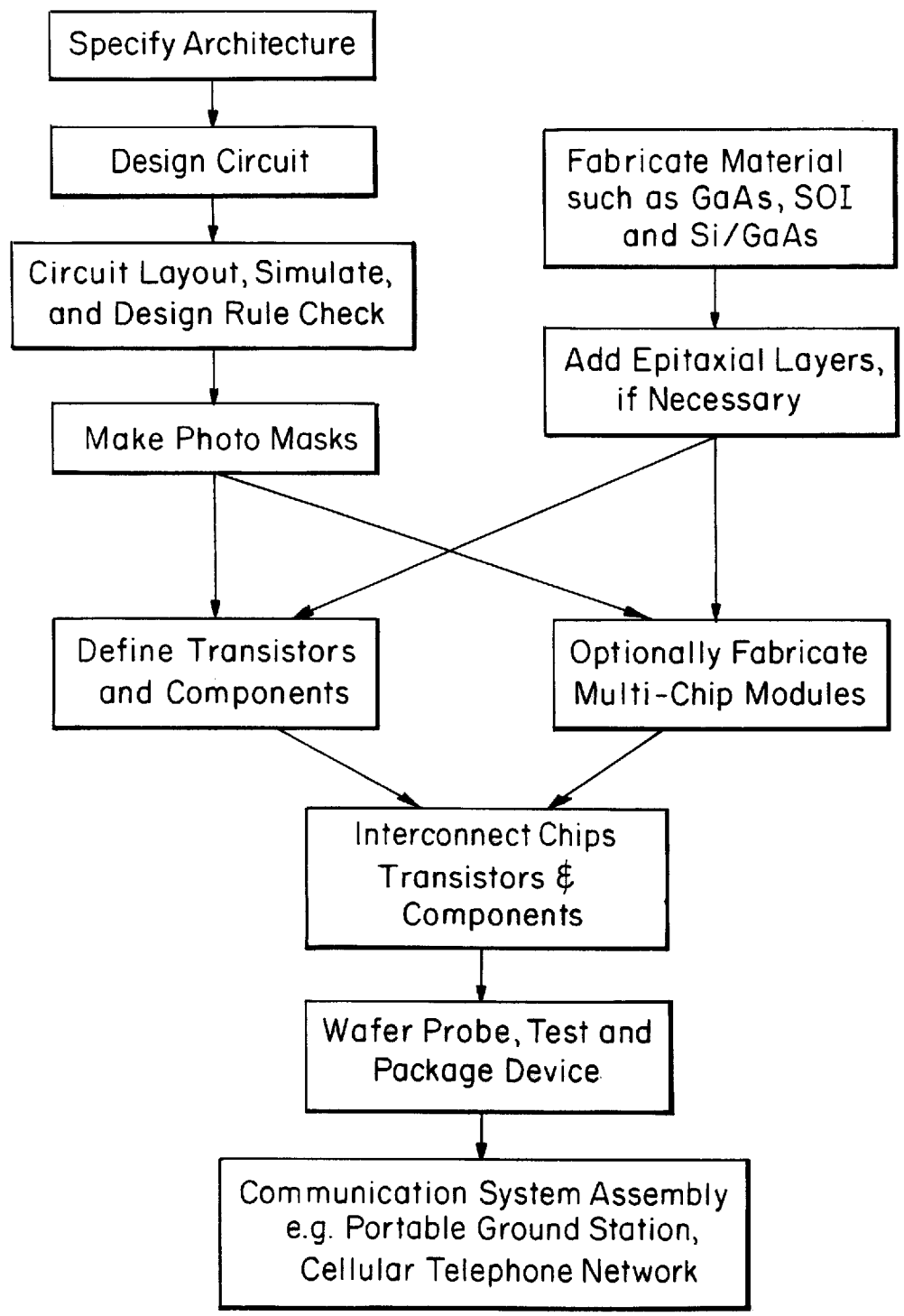
FIGS. 7A–7G are schematic diagrams of the process used to fabricate the invention shown in FIG. 1.
Figure 7B:
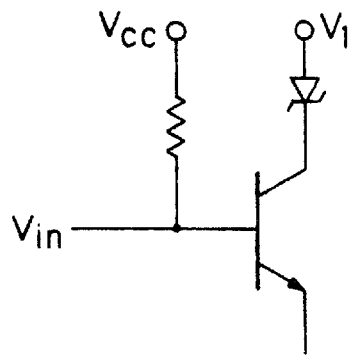

In a preferred embodiment, the high-speed accumulator 30 is fabricated as an integrated circuit 100 in a high-speed semiconductor material, such as GaAs. The use of GaAs fabrication allows the phase accumulator to operate at high frequencies. One well-suited fabrication process is Heterojunction Integrated Injection Logic ($HI^2L$), as developed by Texas Instruments Incorporated. In the $HI^2L$ configuration, transistors are configured as common-emitter-down Heterojunction Bipolar Transistors (HBT). FIGS. 7A–7G illustrate a preferred fabrication process. A general sequence suitable for use with different circuit designs and materials is shown in FIG. 7A for production of communication systems including portable satellite or communication ground stations, cellular telephone networks or Local Area Networks. For illustration, the fabrication process will be explained with reference to fabricating the transistor circuit shown schematically in FIG. 7B. A number of other techniques known to those skilled in the art can also be employed.

Figure 7C:
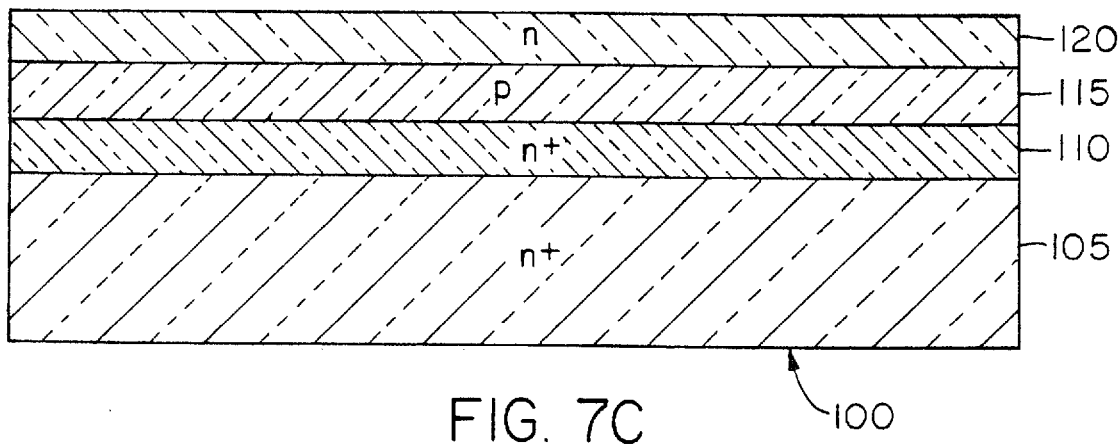

A conductive substrate 105 and epitaxial layers 110,115, 120 are shown in FIG. 7C. These starting materials are Metalorganic Chemical Vapor Deposition (MOCVD) grown on a n$^+$ GaAs substrate 105. The first epitaxial layer 110 is grown on the substrate 105 using n$^+$ AlGaAs. This layer forms the transistor emitter. The second epitaxial layer 115 is grown using n$^-$ GaAs implanted with a p-type dopant such as beryllium. This layer forms the transistor base. The third epitaxial layer 120 is grown using n GaAs. This layer forms the transistor collector.

Figure 7D:
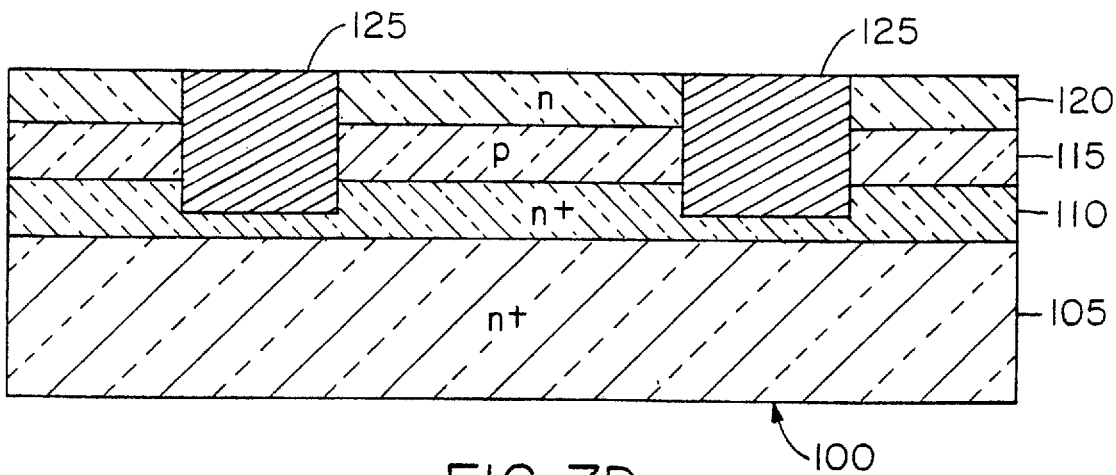
Figure 7E:
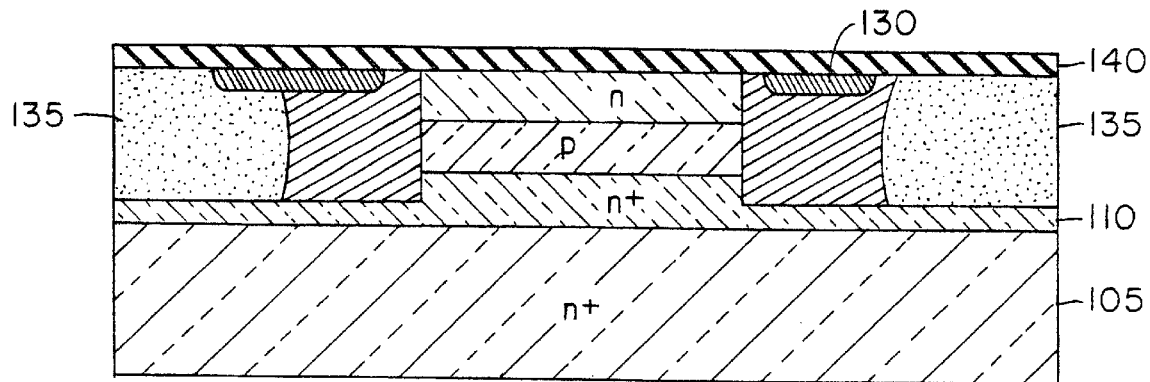
Figure 7F:
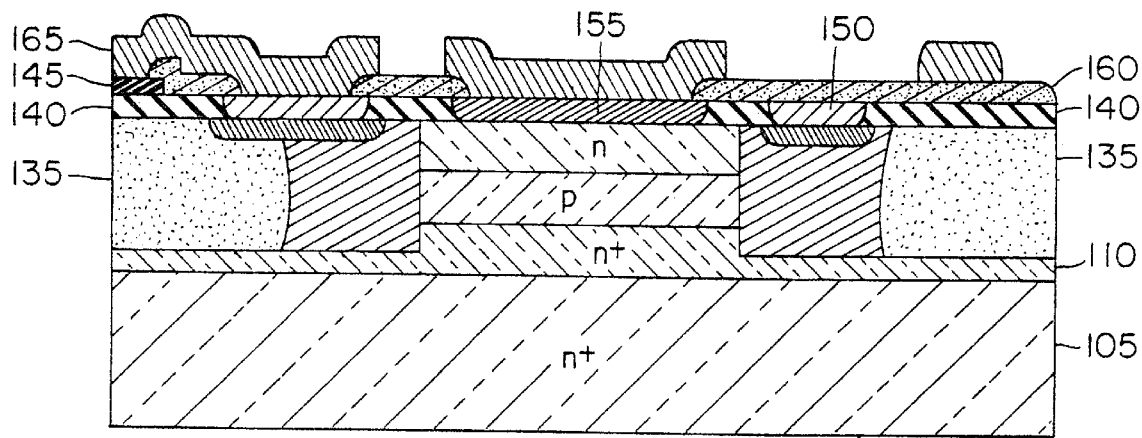

To provide p$^+$ base contacts, a p-type dopant such as beryllium is implanted. The implantation regions 125 are shown in FIG. 7D. FIG. 7E shows the formation of a high surface zinc concentration 130 to improve the yield of p-ohmic base contacts. GaAs isolation regions 135 are then created by using a high-energy boron implant. Both the implantation regions 125 and the isolation regions 135 extend into but not through the first epitaxial layer 110, to provide for the common-emitter. A protective layer 140 of $Si_3N_4$ is then deposited over the surface. Turning to FIG. 7F, a cermet (CrSiO) thin-filmed resister 145 is then RF sputtered and ion milled onto the protective layer 140. The protective layer 140 is then selectively etched away to access the zinc surface 130 and collector region 120. A p-ohmic metal such as AuZn is deposited to create the base contacts 150. A Schottky diode contact 155 connected to the collector is provided by depositing TiPtAu as shown. The interconnect system is then formed with two dielectric-interconnect levels. Both interconnect levels use a $SiO_2$ dielectric and TiWAu interconnects. The first dielectric level 160 is deposited and etched. Optionally, either or both base contacts 150 could be accessed. The first interconnect level 165 is then deposited and etched.

Figure 7G:
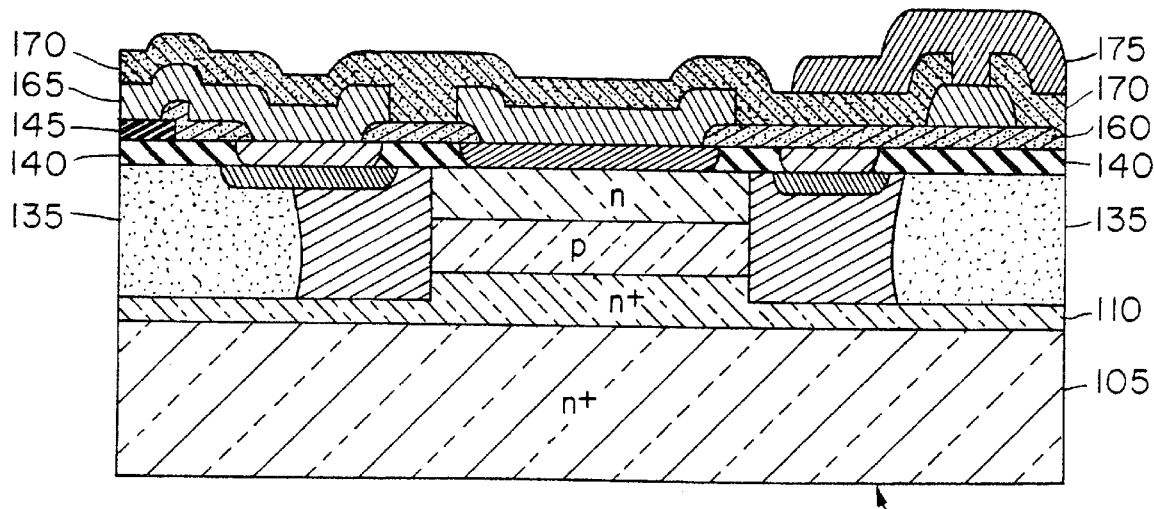

The second dielectric level 170 is deposited and etched as shown in FIG. 7G. Finally, the second interconnect level is deposited and etched.

By using the above-described technology, the invention realizes several advantages. Because all emitters 110 are common and connected to the conduction substrate 105, the only bus required is a power bus for $V_{in}$. The n+ substrate 105 also provides a solid ground. In addition, the Schottky collectors 155 provide for a large fanout for a transistor. Finally, power dissipation can be reduced by changing the value of the cermit resistor 145, which controls gate power. Some components, such as the low pass filters 20, 20', for example, may not be fabricated on the chip but can be externally connected or fabricated in a separate module. Thus different components can be fabricated as separate modules and then stacked and interconnected to form a multi-chip module.

The phase shifter 40 uses a serrodyne vector modulation technique to modulate the carrier signal 3 by the phase from the high-speed phase accumulator 30. The serrodyne technique is inherently single-sideband because it produces a sum frequency but no difference frequency. The vector-modulation phase shifter implementation is well suited for the present invention because the phase shifter 40 is constructed of radio frequency (rf) switches and gain elements, such as amplifiers and passive attenuators. Both of those component types are inherently broadband and stable, thus providing high performance over a wide range of frequencies and operating temperatures.

The real-valued output signal, o(t), given in equation 2 can also be expressed by the equation $$o(t)=a_o(t)[\sin \theta(t) \cos \omega_c t + \cos \theta(t) \sin \omega_c t] \quad (7)$$

where $a_o(t)$ denotes the amplitude (envelope) of the output signal, $\theta(t)$ denotes the periodic phase modulation, and $\omega_c$ denotes the carrier frequency in radians. If the phase shifter has a loss essentially independent of phase, then $a_o(t)$ can be expressed as $$a_o(t)=Aa_c(t); \quad (8)$$

where A denotes a know constant representing the loss. Using equation 8 and substituting the quadrature components, x(t) and y(t), of the carrier signal 3 into equation 6, we obtain $$o(t)=A[x(t) \sin \theta(t)+y(t) \cos \theta(t)]. \quad (9)$$

The phase shifter 40 implements equation 9 to modulate the carrier signal 3. Control logic 42 obtains the phase shift data from the low-speed phase accumulator 30 on data busses 36,37. Data bus 36 carries the two MSBs from data bus 35. The two MSBs 36 control the quadrant selection switches 43,44. Data bus 37 carries the N'-2 remaining LSBs from data bus 35. The N'-2 LSBs 37 represent the first quadrant phase shift. The gain circuits 46, 48 compute the sine and cosine of the first quadrant phase shift using the N'-2 LSBs 37. The quadrant selection switches 43,44 translate the first quadrant gain values into appropriate gain values for each quadrant.

The quadrant selection switches 43,44 use well-known trigonometric identities to translate the first quadrant gain into four-quadrant gain. Quadrant selection switch 43 controls the sign of cosine gain circuit 46 and quadrant selection switch 44 controls the sign of sine gain circuit 48. Table I lists the sign settings of the quadrant selection switches 43,44 for each value of the two MSBs 36.

TABLE I

| MSB | MSB-1 | Quadrant | Switch 43 | Switch 44 |
|-----|-------|----------|-----------|-----------|
| 0   | 0     | 1        | +         | +         |
| 0   | 1     | 2        | +         | −         |
| 1   | 0     | 3        | −         | −         |
| 1   | 1     | 4        | −         | +         |

If a gain sign is negative, then the phase shifter 40 uses the quadrant selection switches 43,44 to invert the corresponding carrier signal component-prior to gain. The switched sine component of carrier signal 3 is operated on by cosine gain circuit 46 and the switched cosine component of carrier signal 3 is operated on by sine gain circuit 48. The resulting output signal components are summed by adder 49 to produce the output signal, o(t), which is filtered by low pass filter 60.

The high-speed phase accumulator 30 synthesizes exact frequencies. The present invention has no phase truncation effects from the high-speed accumulator 30 because the gain circuits 46, 48 use all N' bits. Additionally, due to the high-speed accumulator's 30 low resolution, the phase shifter 40 only needs a small number (i.e. $2^{N'}$) of first-quadrant phase states. In addition, preferred embodiments of the invention expand the bandwidth of the low-frequency DDS 10 by approximately $2^{N'-1}$.

Figure 8A:
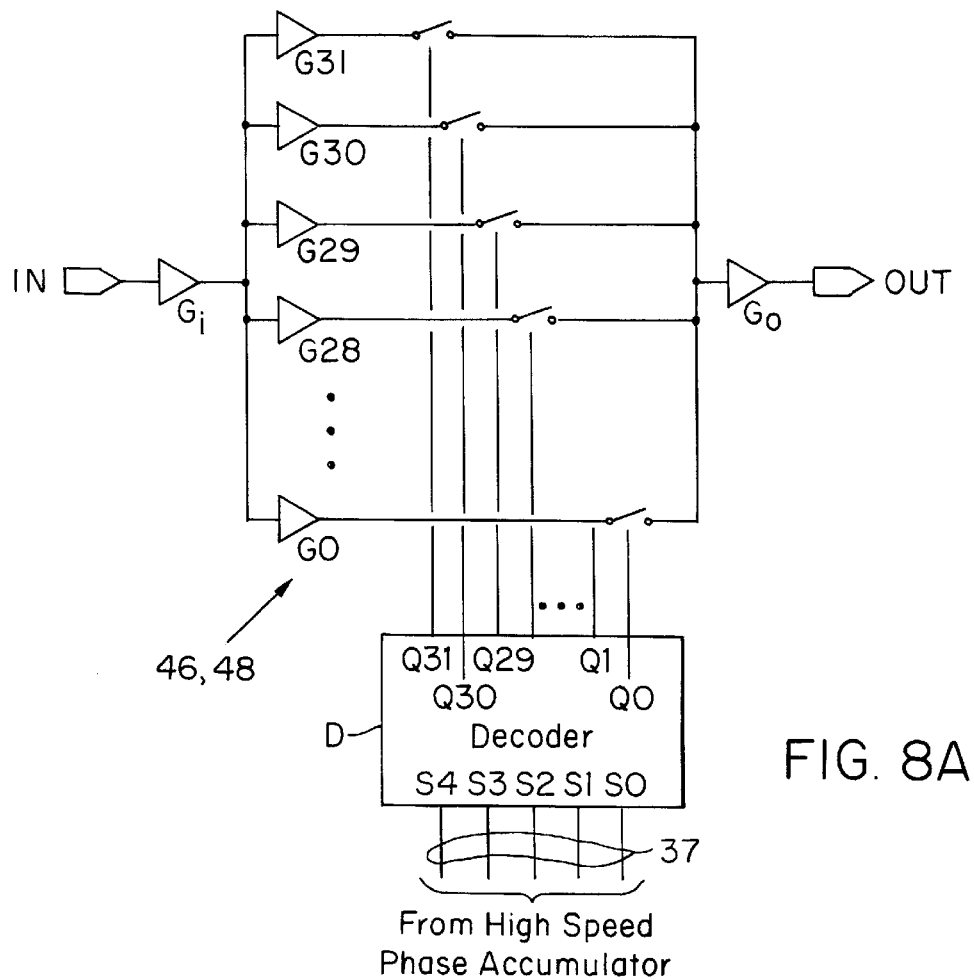
FIGS. 8A and 8B are block diagrams of preferred gain circuits.

FIG. 8A is a block diagram of a preferred embodiment of a switched-gain circuit 46, 48. Because only 32 phase states are needed in a preferred embodiment (N'=7), the gain elements $G_o \ldots G_{31}$ can be realized as individual, exact gain elements $G_o \ldots G_{31}$ for each phase state. The gain elements $G_o \ldots G_{31}$ may be amplifiers (gain>1) or attenuators (gain<1). The gain elements $G_o \ldots G_{31}$, are switched by respective switches $S_o \ldots S_{31}$. The switches $S_o \ldots S_{31}$ are controlled by a 5-to-32 decoder D and connect for one gain element $G_o \ldots G_{31}$ at a time. By using exact gain elements $G_o \ldots G_{31}$, a preferred embodiment eliminates any amplitude truncation effects.

Figure 8B:
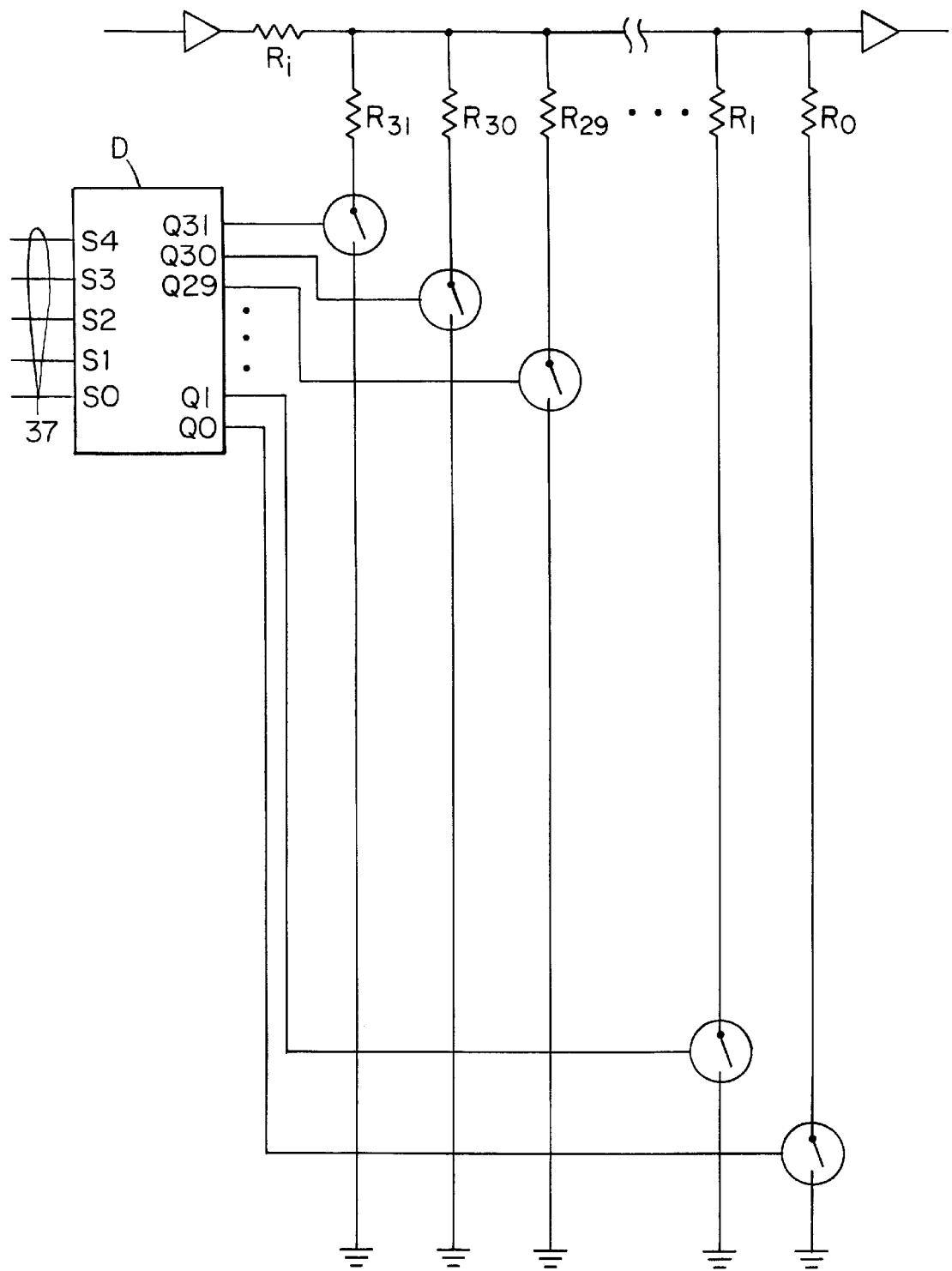

In a preferred embodiment of the invention, the gain elements $G_o \ldots G_{31}$ are attenuators. FIG. 8B is a block diagram of a preferred embodiment of a switched attenuator network. The attenuators $R_o \ldots R_{31}$, are resistive elements, each having a preselected impedance. Thus, the circuit is a resistive voltage divider.

In a preferred embodiment, the phase shifter 40 is fabricated in a high-speed semiconductor material, such as GaAs. The phase shifter 40 is fabricated on-chip with the high-speed accumulator 30. One approach is to implement the phase-shifter 40 using HI²L technology. As previously mentioned with regard to the high-speed accumulator 30, HI²L technology uses emitter-down transistors.

The use of both CMOS and GaAs components reduces the power demands of the present invention in comparison with conventional DDS systems. In a preferred embodiment, the present invention is fabricated as an integrated circuit using a high-density multi-chip module design as described earlier. The low-speed components (DDS 10, low pass filters 20,20', and control unit 50) can be fabricated on Si using CMOS technology. The high-speed components (phase accumulator 30 and phase shifter 40) are fabricated on GaAs. The two components can be formed in a GaAs on Si chip as well.

By fabricating the Si components on-chip with the GaAs components, the invention obtains certain advantages. During fabrication device parameters can be customized to accomplish optimal performance. For example, the size of the low-speed accumulator's 12N-bit register 13 can be increased to allow for higher phase resolution. Likewise, the bit resolution of the ROMs 14,14' and DACs 16,16' can be customized. In addition to customization, single-chip fabrication reduces noise levels, thus contributing to a purer signal.

In a preferred integrated circuit embodiment of the invention, the switched-gain circuits 46,48 use switched feedback amplifiers, all having identical feedback resistors. The input resistor $R_i$ is used to vary the gain of the circuit. This embodiment has the advantage of providing approximately constant impedance and bandwidth, which improves channel tracking and switching performance. A multi-throw switch chooses between amplifier outputs. Because all the switch arms see the same impedance, all switching transients should be identical, minimizing in-band glitch energy. In addition, this embodiment can make the dc level out of the switched gain elements independent of the state.

A preferred integrated circuit embodiment of the invention uses a 6-bit high-speed accumulator 30. Thus, a 16-way switched gain circuit 46,48 is used in place of the 32-way switched gain circuit 46, 48 described above. This embodiment reduces dc power usage at the expense of reduced tuning resolution. Such a trade-off is sufficient where the high-speed clock 5 is driven at around 800 MHz.

Figure 9:
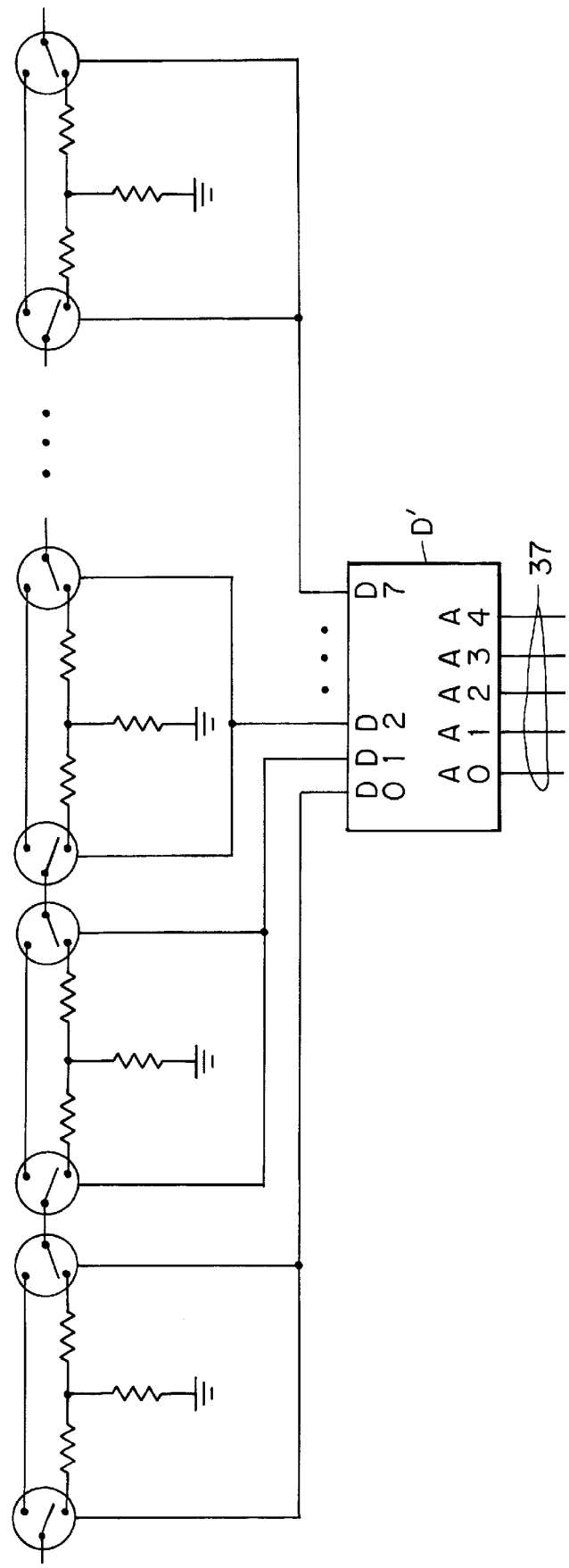
FIG. 9 is a block diagram of an alternative attenuator cascade.

As described, a preferred embodiment of the invention comprises decoded gain elements in the phase shifter 40. Alternatively, a preferred embodiment of the invention could use a more conventional attenuator cascade as shown in the block diagram of FIG. 9. The attenuator cascade would require a sufficient number of bits to minimize the effect of amplitude quantization. Although attenuator and switch nonlinearities will be present, they will produce only a few, broadly spaced, spurious signals due to the small number of bits in the low-speed phase accumulator 30.

Figure 10:
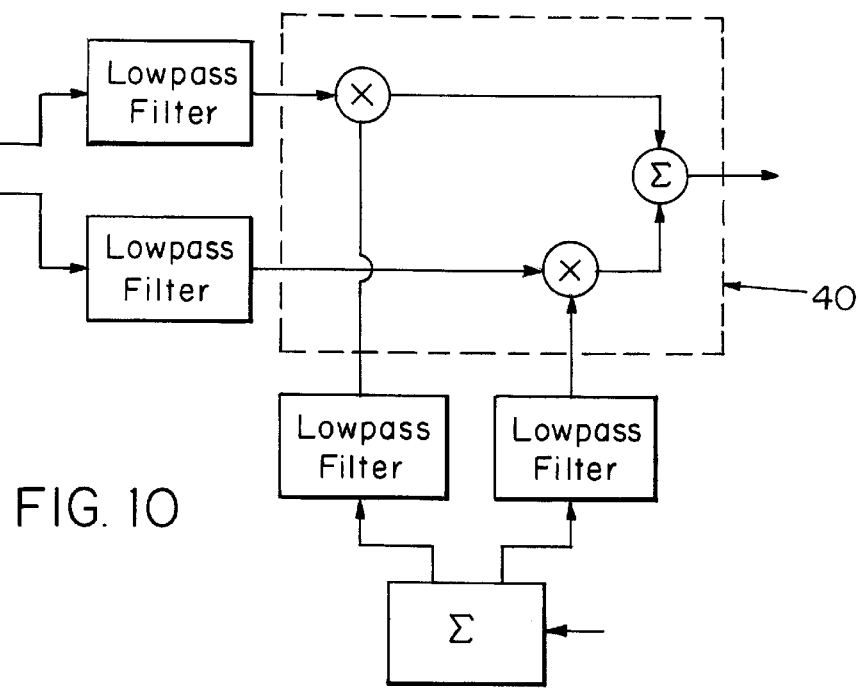
FIG. 10 is a block diagram of an alternative embodiment of the invention.

As described, the invention uses vector modulation techniques. FIG. 10 is a block diagram of an alternative single-sideband (SSB) mixing embodiment. In many respects, the SSB-mixing alternative is similar to the switched-gain embodiment. Like in the switched-gain embodiment, the SSB-mixing alternative employs a low-speed, high-resolution DDS in conjunction with a high-speed, low-resolution phase accumulator. Like in the switched-gain embodiment, all needed phase shifts are obtained digitally and dc power is considerably reduced in comparison with conventional high-speed DDSs. Instead of using the two-channel switched-gain method, the SSB-mixing approach uses two channels of high-speed ROMs, DACs, and low pass filters.

While the SSB-mixing approach may appear similar to the switched-gain embodiment, the SSB-mixing approach is inferior. First, unless the mixers use true four-quadrant multipliers, a 3-1 mixer spur limits the bandwidth to a 3:1 range. In contrast, a preferred embodiment uses conventional mixers, but effectively removes the 3-1 spur by precise wave-shaping. The same is true for 5-1 and 7-1 spurs, etc. Secondly, the SSB-mixing approach requires two high-speed ROMS, whereas a preferred embodiment instead uses simpler decoders. Finally, the SSB-mixing approach requires two additional phase- and amplitude-matched low pass filters that the switched-gain embodiment does not need.

Although the fabrication process has been described in terms of HI²L technology, there are other suitable alternatives. One such approach is Diode-HBT-Logic (DHL) being developed by Rockwell International. DHL is implemented with GaAlAs/GaAs HBTs and Schottky diodes. Rockwell's approach utilizes a semi-insulating GaAs substrate. Another such approach is ECL/TTL Turbo Logic being developed by Applied Micro Circuits Corporation. The ECL/TTL Turbo Logic is silicon based and can operate at frequencies of 1.25 GHz.

Figure 11:
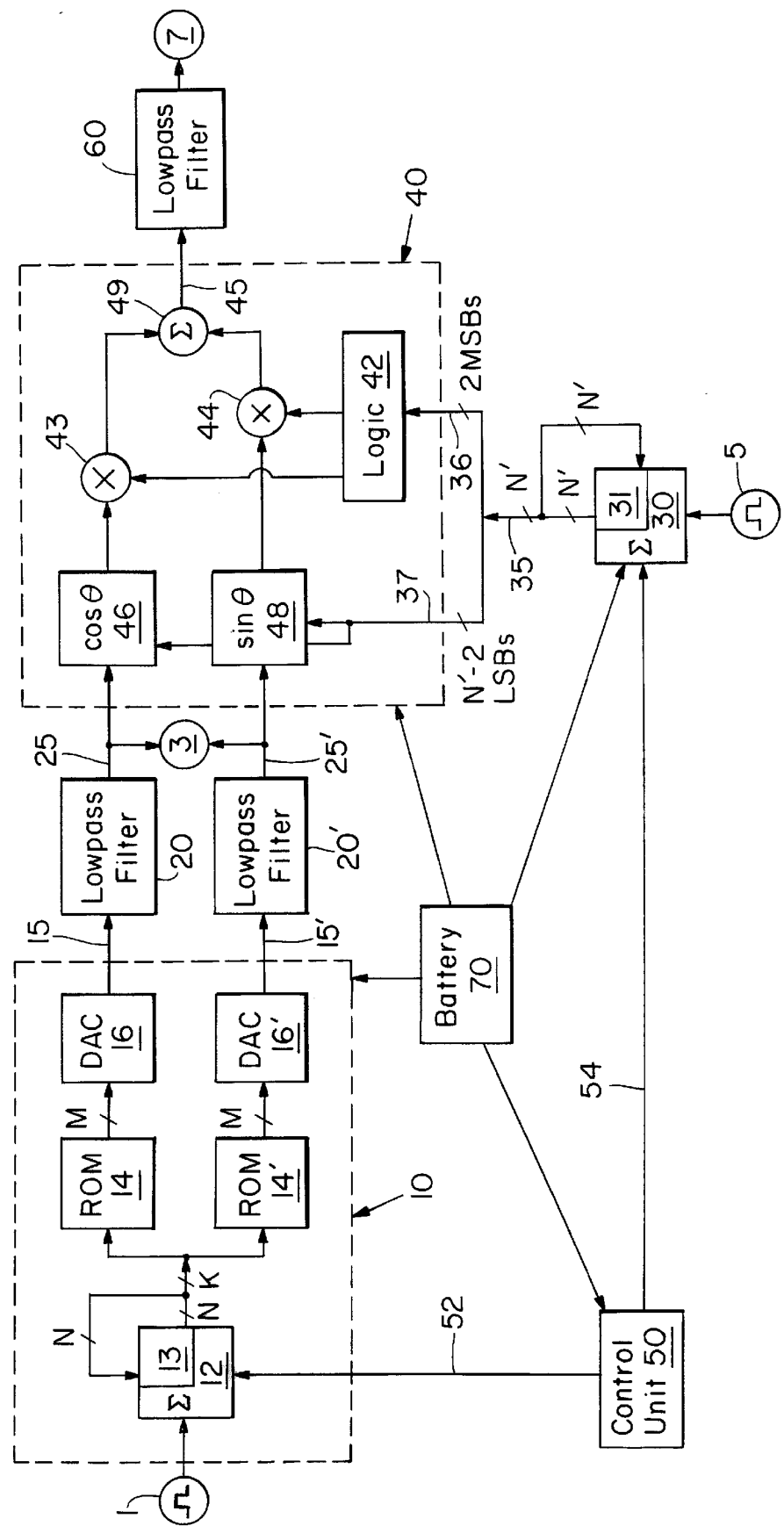
FIG. 11 is a block diagram of another embodiment of the invention.

FIG. 11 is a block diagram of another preferred embodiment of the invention. In this embodiment, the signal is attenuated (or amplified) before the quadrant is selected. The switched-gain circuits 46, 48 are coupled between the low pass filters 20, 20' and the quadrant selection switches 43, 44. An advantage of this embodiment is that because the signals flowing out of the low-speed, high-resolution DDS are at low frequencies (e.g., less than 20 MHz), the gain elements only work at these low frequencies, which greatly simplifies the switched-gain circuits 46, 48. Where the gain elements follow the quadrant selection switches 43, 44 as in FIG. 1, high frequency (at least 350 MHz) signals generated by the quadrant switching must pass undistorted through the gain elements. Because these gain elements must have precise phase and amplitude tracking, implementation can be simplified by lowering the frequency range from approximately 350 MHz to approximately 20 MHz. In the embodiment of FIG. 11, only the quadrant selection switches 43, 44 must operate at high speeds.

Figure 12:
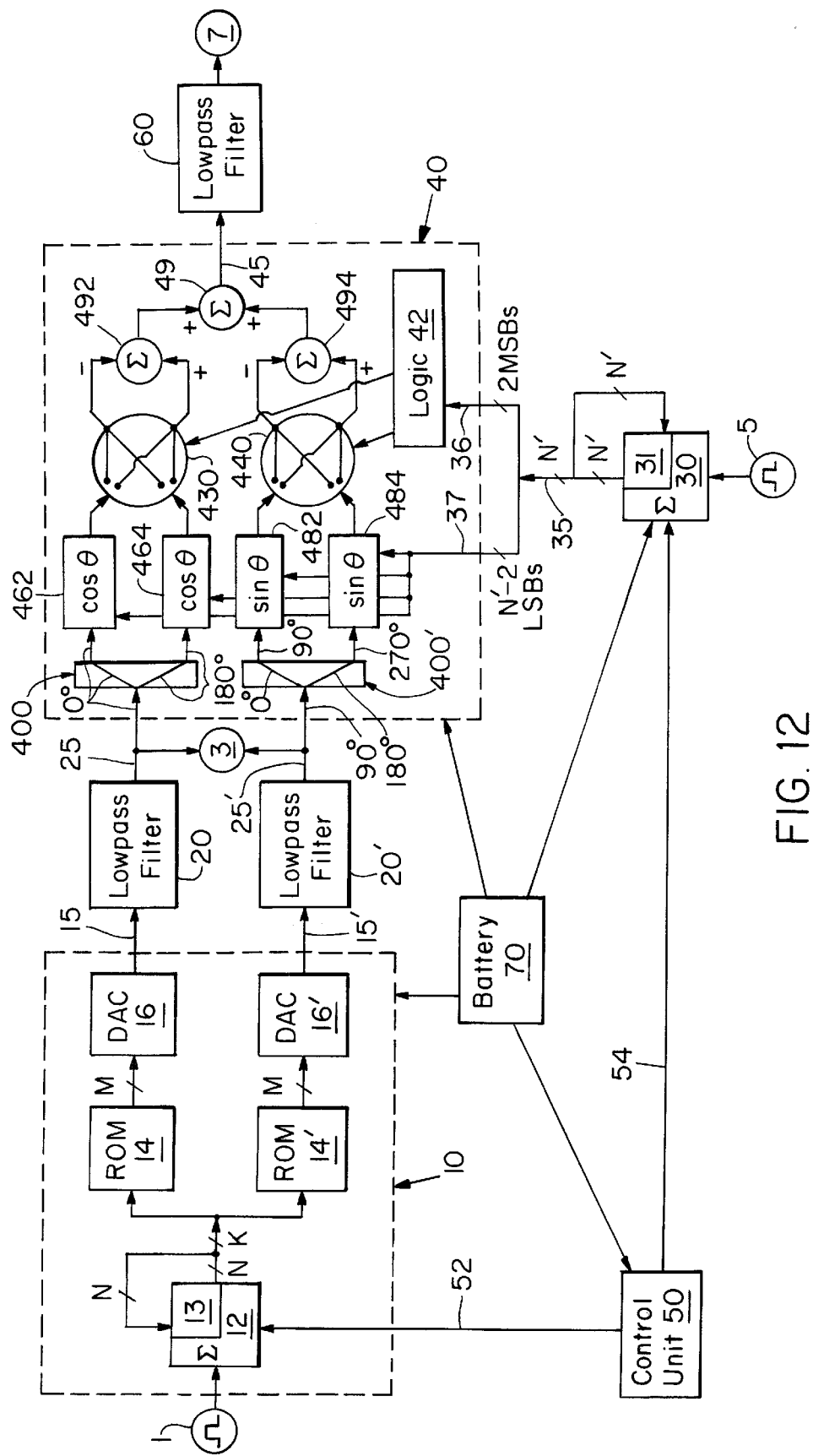
FIG. 12 is a block diagram of yet another embodiment of the invention.

FIG. 12 is a block diagram of another preferred embodiment of the invention. In this embodiment, the switched-gain circuits 46, 48 are implemented using a balanced design. In this embodiment, the quadrant selection switches and the switched-gain circuits 46, 48 are integrated into a single balanced design (i.e., split, amplify, switch, switch, combine). It is understood that two separate balance designs (i.e., split, amplify, switch, combine, split, switch, combine) could be used instead. The carrier signals on data busses 25, 25' are split by a respective signal splitter 400, 400' into two signals, one of which is 180° out-of-phase. The two splitters 400, 400' thus provide 4-quadrants of the carrier signal. Each quadrant is processed by a respective gain circuit 462, 464, 482, 484. The gain-processed signals are then switched by quadrant selection switches 430, 440, which are controlled by the logic 42. The signals are then combined or subtracted by combiners 422, 494. The resulting signals are then combined by combiner 49 to produce the output signal.

This preferred embodiment eliminates two pairs of splitters/combiners, which reduces complexity, power consumption, and distortion. Of particular importance, any switching noise added to the signal path by the switched-gain elements switches, the quadrant switches, or introduced from adjacent digital circuitry, is cancelled out by the output combiners (subtractors). This balanced embodiment improves switching noise rejection by about 20–30 db and improves even-order harmonic distortion products by a similar amount. In addition, because most integrated circuits are dc coupled, the switched gain circuit 46, 48 can have a dc level shift between the various states. This balanced embodiment remove such undesired dc shifts.

Equivalents

Although the invention has been particularly shown and described with reference to a preferred embodiment thereof, it will be understood by those skilled in the art that various changes in form and details may be made therein without departing from the spirit and scope of the invention as defined by the appended claims.

These and all other equivalents are intended to be encompassed by the following claims.

I claim:

1. An apparatus for synthesizing an output waveform having an output frequency within an output frequency band, comprising:
    a first circuit to provide an analog signal having a first frequency, the analog signal including a plurality of analog signal components, each analog signal component representing a respective phase of the analog signal; and
    a second circuit having a phase shifter with an input frequency to serrodyne modulate each of the analog signal components generated by the first circuit, the second circuit generating a rotating phase driven at a periodic rate;
    a combiner to selectively combine the modulated analog signal components to form the synthesized output waveform; and
    an output filter coupled to the second circuit for filtering the output signal and passing only frequencies substantially within the output frequency band.

2. The apparatus of claim 1 further comprising a control unit electrically connected to the first circuit and the second circuit, the control unit selecting the first frequency of the first circuit and the input frequency of the second circuit based on the output frequency.

3. The apparatus of claim 1 wherein the first circuit and the second circuit are at least one integrated circuit.

4. The apparatus of claim 1 wherein the first circuit and the second circuit comprise a frequency synthesizer for a portable communication system.

5. The apparatus of claim 4 wherein the portable communication system is battery powered.

6. The apparatus of claim 4 wherein there are a plurality of output frequencies which are frequency-hopped by a data processor.

7. The apparatus of claim 4 wherein the system comprises a cellular telephone network.

8. The apparatus of claim 4 wherein the system comprises a portable ground station unit.

9. The apparatus of claim 4 wherein the system is a wireless Local Area Network.

10. The apparatus of claim 1 wherein the first circuit is driven by a first clock frequency, which is less than the maximum frequency within the output frequency band, the second circuit is driven by a second clock frequency, which is greater than the maximum frequency within the output frequency band, and the second clock frequency is an even multiple of twice the first clock frequency.

11. The apparatus of claim 10 wherein the analog signal is an alternating electrical signal comprising a first approximation and a second approximation of a sine wave, the second approximation being substantially 90 degrees out-of-phase with respect to the first approximation.

12. The apparatus of claim 10 wherein a control unit computes the first frequency based on the value of the output frequency.

13. The apparatus of claim 1 further comprising a filter coupled between the first circuit and the second circuit, the filter passing only frequencies substantially within a carrier frequency band.

14. The apparatus of claim 1 wherein the respective phases are multiples of 90°.

15. The apparatus of claim 1 wherein the second circuit includes a balanced gain network having trigonometric-function gain elements.

16. The apparatus of claim 15 wherein the gain elements are analog devices.

17. A method of synthesizing an output signal from digital clock signals, comprising the step of:
    synthesizing an analog carrier signal of a first frequency, the analog carrier signal including a plurality of carrier signal components, each carrier signal component representing a respective phase of the analog carrier signal;
    modulating each of the analog carrier signal components by a phase shift signal of a second frequency based on a trigonometric function of the second frequency; and
    selectively combining the modulated carrier signal components to produce the output signal.

18. The method of claim 17 further comprising the step of tuning the carrier signal.

19. The method of claim 18 wherein the tuning step comprises tuning the carrier signal with a resolution of less than 1 Hz.

20. The method of claim 17 wherein the step of modulating comprises:
    computing the first frequency and a phase shift frequency from the output frequency;
    generating an electrical signal from a digital clock signal, the electrical signal having a frequency substantially equal to the phase shift frequency; and
    modulating the carrier signal components with the electrical signal from the digital clock.

21. The method of claim 17 wherein the respective phases are multiples of 90°.

22. The method of claim 17 wherein the step of modulating comprises processing the carrier signal components by a balanced gain circuit which includes a plurality of trigonometric gain elements.

23. An integrated circuit for synthesizing an output waveform having an output frequency within an output frequency band, comprising:
    a first circuit to provide an analog signal having a first frequency, the analog signal including a plurality of analog signal components, each analog signal component representing a respective phase of the analog signal; and
    a second circuit having a phase shifter with an input frequency to serrodyne modulate each of the analog signal components generated by the first circuit, the second circuit generating a rotating phase driven at a periodic rate;
    a control unit electrically connected to the first circuit and the second circuit, the control unit selecting the first frequency of the first circuit and the input frequency of the second circuit based on the output frequency being synthesized; and
    a combiner to selectively combine the modulated analog signal components to form the synthesized output waveform.

24. The integrated circuit of claim 23 wherein the first circuit comprises a direct digital synthesizer for generating the analog signal from a clock signal.

25. The integrated circuit of claim 23 wherein the second circuit comprises a phase accumulator for generating an electrical signal of the input frequency from a clock signal.

26. The integrated circuit of claim 23 wherein the phase shifter includes a plurality of analog gain elements to generate a trigonometric function based on the input frequency.

27. The integrated circuit of claim 23 wherein at least the second circuit comprises a plurality of transistor emitters coupled to a common conductive substrate.

28. The integrated circuit of claim 27 wherein the transistors are common-emitter-down Heterojunction Bipolar Transistors.

29. The integrated circuit of claim 27 wherein the common conductive substrate provides a ground.

30. The integrated circuit of claim 23 wherein the respective phases are multiples of 90°.

31. The integrated circuit of claim 23 wherein the second circuit includes a balanced gain network having the gain elements.

32. A direct digital synthesizer comprising:
at least one digital circuit module to synthesize an analog signal of an output frequency from digital signals, the at least one digital circuit module including:
i) a first circuit to synthesize an analog signal having a plurality of analog signal components of a first frequency, each analog signal component representing a respective phase of the analog signal; and
ii) a second circuit to modulate each of the analog signal components of the first frequency by a modulation signal of a second frequency, the second circuit having a phase shifter which includes a plurality of gain elements, each gain element having a value selected so the phase shifter implements a trigonometric function in response to the modulation signal.

33. The direct digital synthesizer of claim 32 wherein the digital circuit module is an integrated circuit.

34. The direct digital synthesizer of claim 32 wherein the respective phases are multiples of 90°.

35. The direct digital synthesizer of claim 32 wherein the second circuit includes a balanced gain network which includes the gain elements.

36. The direct digital synthesizer of claim 32 further comprising a filter module to filter the synthesized analog signal.

37. An apparatus for vector modulating an analog input signal by a clock signal, comprising:
a plurality of analog input channels, each input channel representing a respective phase of the analog input signal;
a balanced gain network having a plurality of analog gain elements for modulating each of the analog input channels based on a trigonometric function in response to the clock signal to form a plurality of modulated signals; and
a combiner for selectively combining the modulated signals to form an output waveform.

38. The apparatus of claim 37 wherein each input channel represents a phase quadrant of the analog input signal.

39. The apparatus of claim 37 wherein the gain elements are analog devices.

40. The apparatus of claim 37 where the combiner includes a selection network responsive to the clock signal for selecting the modulated signals to be combined.

41. The apparatus of claim 37 wherein the combiner includes a subtractor circuit.

42. A method for vector modulating an analog input signal by a clock signal, comprising the steps of:
providing a plurality of analog input channels, each input channel representing a respective phase of the analog input signal;
providing a balanced gain network having a plurality of gain elements for implementing a trigonometric function in response to the clock signal;
modulating each of the analog input channels by the trigonometric function of the balanced gain network to form a plurality of modulated signals; and
selectively combining the modulated signals to form an output waveform.

43. The method of claim 42 wherein each input channel represents a phase quadrant of the analog input signal.

44. The method of claim 42 wherein the gain elements are analog devices.

45. The method of claim 42 where the step of selectively combining comprises selecting modulated signals to be combined in response to the clock signal.

46. The method of claim 42 wherein the step of selectively combining includes subtracting selected modulated signals.

47. An integrated circuit for digitally synthesizing an analog output frequency, comprising:
a first circuit to provide an analog signal, the first circuit having a plurality of analog output channels, each channel carrying a respective analog signal component, each analog signal component representing a respective phase quadrant of the provided analog signal;
a second circuit with a modulation input to modulate the analog signal components from the first circuit, the second circuit having a phase shifter which includes a plurality of gain elements, each gain element having a value selected so the phase shifter implements a trigonometric function in response to signals from the modulation input, the phase shifter disposed between a plurality of analog input channels and an output channel; and
an interconnection coupling each analog output channel of the first circuit to a respective input channel of the second circuit.

48. The integrated circuit of claim 47 further comprising a control unit interconnected to the first and second circuits.

49. The integrated circuit of claim 47 wherein the first circuit comprises a direct digital synthesizer.

50. The integrated circuit of claim 47 wherein the second circuit comprises a phase accumulator interconnected with the phase shifter to generate signals for the modulation input.

51. The integrated circuit of claim 47 wherein the second circuit comprises a balanced gain network for modulating the analog signal components.

52. An apparatus on a semiconductor substrate for digitally synthesizing an analog output frequency, comprising:
a first and a second digital clock port;
an output analog signal port;
a control unit;
a direct digital synthesizer interconnected with the first clock port and the control unit having a first and a second analog output channel;
a first and a second low pass filter, the first output channel of the direct digital synthesizer interconnected with the first low pass filter and the second output channel of the direct digital synthesizer interconnected with the second low pass filter;
a phase shifter having a first and a second analog input channel and an output channel, the first low pass filter interconnected with the first input channel of the phase shifter, the second low pass filter interconnected with the second input channel of the phase shifter, and the output signal port interconnected with the output channel of the phase shifter;
a high-speed accumulator having an N' bit data register, the second clock port interconnected with the high-speed accumulator, the control unit interconnected with the high-speed accumulator, and the phase shifter interconnected with the high-speed accumulator to serrodyne modulate the signals received by the phase shifters from the first and second analog input channels by a rotating phase generated by the high speed accumulator in response to a clock frequency received from the second clock port; and a third low pass filter interconnected with the output channel of the phase shifter.

53. The apparatus of claim 52 wherein the direct digital synthesizer comprises:

a low-speed phase accumulator having a N bit data register, the low-speed phase accumulator having a first and a second K bit output data bus, the first clock port interconnected with the low-speed accumulator;

a first and a second Read-Only Memory (ROM), each ROM having $2^K$ address locations, each address location containing a M bit word, the first output data bus of the low-speed phase accumulator interconnected with the first ROM and the second output data bus of the low-speed phase accumulator interconnected with the second ROM; and a first and a second digital-to-analog converter, each digital-to-analog converter having $2^M$ address locations, the first digital-to-analog converter providing the first output channel of the direct digital synthesizer and the second digital-to-analog converter proving the second output channel of the direct digital synthesizer, the first ROM interconnected with the first digital-to-analog converter and the second ROM interconnected with the second digital-to-analog converter.

54. The method of claim 52 wherein the phase shifter comprises a balanced gain network interconnected with the analog input channels of the phase shifter.

* * * * *